United States Patent
Maa et al.

(10) Patent No.: US 7,037,856 B1
(45) Date of Patent: May 2, 2006

(54) METHOD OF FABRICATING A LOW-DEFECT STRAINED EPITAXIAL GERMANIUM FILM ON SILICON

(75) Inventors: Jer-Shen Maa, Vancouver, WA (US); Douglas J. Tweet, Camas, WA (US); Jong-Jan Lee, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 11/149,883

(22) Filed: Jun. 10, 2005

(51) Int. Cl.
*H01L 21/31* (2006.01)
(52) U.S. Cl. .................................. 438/758
(58) Field of Classification Search ............ 438/94, 438/479, 507, 509, 603, 607, 706, 758
See application file for complete search history.

(56) References Cited

U.S. PATENT DOCUMENTS

| | | | |
|---|---|---|---|
| 6,537,370 B1 | 3/2003 | Hernandez et al. | |
| 6,635,110 B1 | 10/2003 | Luan et al. | |
| 6,682,965 B1* | 1/2004 | Noguchi et al. | 438/199 |
| 6,882,025 B1* | 4/2005 | Yeo et al. | 257/510 |
| 2001/0003364 A1* | 6/2001 | Sugawara et al. | 257/192 |
| 2004/0075142 A1* | 4/2004 | Matsuhashi | 257/347 |
| 2004/0212035 A1* | 10/2004 | Yeo et al. | 257/510 |
| 2005/0070115 A1* | 3/2005 | Maa et al. | 438/706 |
| 2005/0205929 A1* | 9/2005 | Nagano et al. | 257/347 |

OTHER PUBLICATIONS

Hofmann et al., *Surfactant-grown low-doped germanium layers on silicon with high electron mobilities*, Thin Solid Films 321, pp. 125-130 (1998).

Luan et al., *High-quality Ge epilayers on Silicon with low threading-dislocation densities*, Appl Phys Let 75, pp. 2909-2911 (1999).

Colace et al., *Efficient high-speed near-infrared Ge photodetectors integrated on Silicon substrates*, Appl Phys Let. 76, pp. 1231-1233 (2000).

Famà et al., *High performance germanium-on-silicon detectors for optical communications*, Appl Phys Let 81, pp. 586-588 (2002).

Ritenour et al., *Epitaxial Strained Germanium p-MOSFETs with HfO2 Gate Dielectric and TaN Gate Electrode*, International Electron Devices Meeting Technical Digest, Washington, DC, (2003).

Chui et al., *A Germanium NMOSFET Process Integrating Metal Gate and Improved Hi-k Dielectrics*, International Electron Devices Meeting Technical Digest, Washington, DC, (2003).

(Continued)

*Primary Examiner*—W. David Coleman
*Assistant Examiner*—Jarrett Stark
(74) *Attorney, Agent, or Firm*—Robert D. Varitz, PC

(57) ABSTRACT

A method of fabricating a germanium film on a silicon substrate includes preparing a silicon substrate; depositing a first germanium film to form a continuous germanium film on the silicon substrate; annealing the silicon substrate and the germanium film thereon in a first annealing process to relax the germanium film; depositing a second germanium film on the first germanium film to form a germanium layer; patterning and etching the germanium layer; depositing a layer of dielectric material on the germanium layer; cyclic annealing the silicon substrate having the germanium layer and dielectric material thereon; and completing a device containing the silicon substrate and germanium layer.

18 Claims, 11 Drawing Sheets

OTHER PUBLICATIONS

Low et al., *Germanium MOS: An Evaluation from Carrier Quantization and Tunneling Current*, 2003 Symposium on VLSI Technology Digest, pp. 117-118.

Bai et al., *Ge MOS Characteristics with CVD $HfO_2$ Gate Dielectrics and TaN Gate Electrode*, 2003 Symposium on VLSI Technology Digest, pp. 121-122.

Hartmann et al., *Reduced pressure-chemical vapor deposition of Ge thick layers on Silicon (001) for 1.3-1.55-µm photodetection*, Journal of Applied Physics 95, pp. 5905-5913 (2004).

Cannon et al., *Tensile strained epitaxial Ge films on Silicon (100) substrates with potential application in L-band telecommunications*, Appl Phys Let. 84, pp. 906-908 (2004).

Liu et al., *Silicidation-induced band gap shrinkage in Ge epitaxial films on Silicon*, Appl Phys Let. 84, p. 660 (2004).

* cited by examiner

METHOD OF FABRICATING A LOW-DEFECT STRAINED EPITAXIAL GERMANIUM FILM ON SILICON

FIELD OF THE INVENTION

This invention relates to infra-red and visible light photo detection and high speed CMOS devices.

BACKGROUND OF THE INVENTION

Germanium has much higher electron and hole mobility than silicon, therefore it may be a possible replacement for silicon as used in high speed CMOS devices, Ritenour et al., *Epitaxial Strained Germanium p-MOSFETs with HfO2 Gate Dielectric and TaN Gate Electrode*, International Electron Devices Meeting Technical Digest, 2003, Washington, D.C.; Chui et al, *A Germanium NMOSFET Process Integrating Metal Gate and Improved Hi-k Dielectrics*, International Electron Devices Meeting Technical Digest, 2003, Washington, D.C.; Low et al., *Germanium MOS: An Evaluation from Carrier Quantization and Tunneling Current*, 2003 Symposium on VLSI Technology Digest, pp 117–118; and Bai et al., *Ge MOS Characteristics with CVD $HfO_2$ Gate Dielectrics and TaN Gate Electrode*, 2003 Symposium on VLSI Technology Digest, pp 121–122.

Pure germanium, grown directly on silicon, is the best candidate for near-infrared photodetectors because of its compatibility with silicon technology, and its high absorption in near-infrared wavelengths, up to 1.55 µm. It has potential applications in low-cost monolithic transceivers for optical communications, Colace et al., *Efficient high-speed near-infrared Ge photodectors integrated on Silicon substrates*, App Phy Let. 76, pp 1231–1233 (2000); Famà et al., *High performance germanium-on-silicon detectors for optical communications*, App Phy Let. 81, pp 586–588 (2002); and Hartmann et al., *Reduced pressure-chemical vapor deposition of Ge thick layers on Silicon* (001) *for 1.3–1.55-µm photodetection*, Journal of Applied Physics 95, pp 5905–5913 (2004). Because of the process compatibility with state-of-the-art silicon fabrication processes, it is possible to integrate high-speed devices containing germanium-based photodetectors into silicon ICs many applications.

However, because of the large lattice mismatch between germanium and silicon (4.2%), it is not easy to form germanium films on silicon which have the requisite flatness and low defect density required for high speed devices. Ritenour et al., supra, reported their work of epitaxial strained germanium p-MOSFET by growing thin germanium layer on thick relaxed SiGe buffer layer. Hofmann was able to grow a 1-µm thick relaxed germanium layer by surfactant-mediated epitaxy on (111) silicon, Hofmann et al., *Surfactant-grown low-doped germanium layers on silicon with high electron mobilities*, Thin Solid Films 321, pp 125–130 (1998). Luan et al. reported a technique to deposit a germanium epilayer on single crystal silicon by first depositing at 350° C. and then at 600° C., Luan et al., *High-quality Ge epilayers on Silicon with low threading-dislocation densities*, App Phy Let. 75, pp 2909–2911 (1999), and U.S. Pat. No. 6,635,110 B1, to Luan et al., granted Oct. 21, 2003, for *Cycle thermal anneal for dislocation reduction*. This two-step process was also reported in U.S. Pat. No. 6,537,370 B 1, to Hernandez et al., granted Mar. 25, 2003, for *Process for obtaining a layer of single-crystal germanium on a substrate of single-crystal silicon, and products obtained*. Luan et al, supra, also reported the technique of cyclic annealing to reduce the defect density of the germanium film. Using similar technique, several groups have reported the application in near-infrared germanium photodetectors Colace et al., Famà et al., and Hartmann et al., supra. We have also demonstrated the advantage of cyclic annealing. After cyclic annealing, the defects are reduced and concentrated near the Ge/Si interface.

Threading dislocation density of germanium film is expected to be reduced significantly by cyclic annealing, as described in the works of Colace et al., Famà et al., and Hartmann et al., supra; and by Luan et al. and Hernandez et al., supra, by the technique of forming threading dislocation at the sample edge. In small etched mesa structures, the average threading dislocation density decreased with the decrease of mesa sidewall width, Luan et al., supra. Here, the mesa sidewall served as a dislocation sink.

However, cavity formation in germanium film as a result of cyclic annealing has been detected. This undesired phenomenon can deteriorate the surface smoothness, affect the device performance, and increase the leakage current. A method is to needed to prevent cavity formation during cyclic annealing, and to prepare a smooth film after annealing at a temperature close to the melting point of germanium.

The absorption of bulk germanium falls rapidly beyond the direct band gap of 0.8 eV, corresponding to 1.55 µm. Previous works, cited herein, demonstrate that CVD deposited germanium films, if processed through heating and cooling steps, exhibited a tensile strain of 0.21% in the germanium film due to the difference of thermal expansion coefficient between germanium and silicon. Germanium band gap was reduced to 0.768 eV with this strain, and the absorption spectrum was pushed to 1.610 µm, Cannon et al., *Tensile strained epitaxial Ge films on Silicon* (100) *substrates with potential application in L-band telecommunications*, App Phy Let. 84, pp 906–908 (2004). The germanium band-gap was further reduced to 0.773 eV and 0.765 eV after silicidation at the backside of the wafer, corresponding to 1.620 µm, Liu et al., *Silicidation-induced band gap shrinkage in Ge epitaxial films on Silicon*, Appl Phys Let. 84, p660 (2004). A simpler method which does not require a silicidation step, is preferable because silicidation frequently results in metal contamination during the front-end processes.

SUMMARY OF THE INVENTION

A method of fabricating a germanium film on a silicon substrate includes preparing a silicon substrate; depositing a first germanium film to form a continuous germanium film on the silicon substrate; annealing the silicon substrate and the germanium film thereon in a first annealing process to relax the germanium film; depositing a second germanium film on the first germanium film to form a germanium layer; patterning and etching the germanium layer; depositing a layer of dielectric material on the germanium layer; cyclic annealing the silicon substrate having the germanium layer and dielectric material thereon; and completing a device containing the silicon substrate and germanium film.

It is an object of the invention to fabricate a low-defect, strained germanium film on a silicon substrate by CVD followed by cyclic annealing.

Another object of the invention is to provide formation of a germanium film on silicon which does not have cavities formed therein during cyclic annealing.

A further object of the invention is to prepare a smooth germanium layer after annealing at a temperature close to the melting point of germanium.

Another object of the invention is to increase the strain of germanium film using a technique without any metal contamination, i.e., which does not require a silicidation process.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

Figure 1:
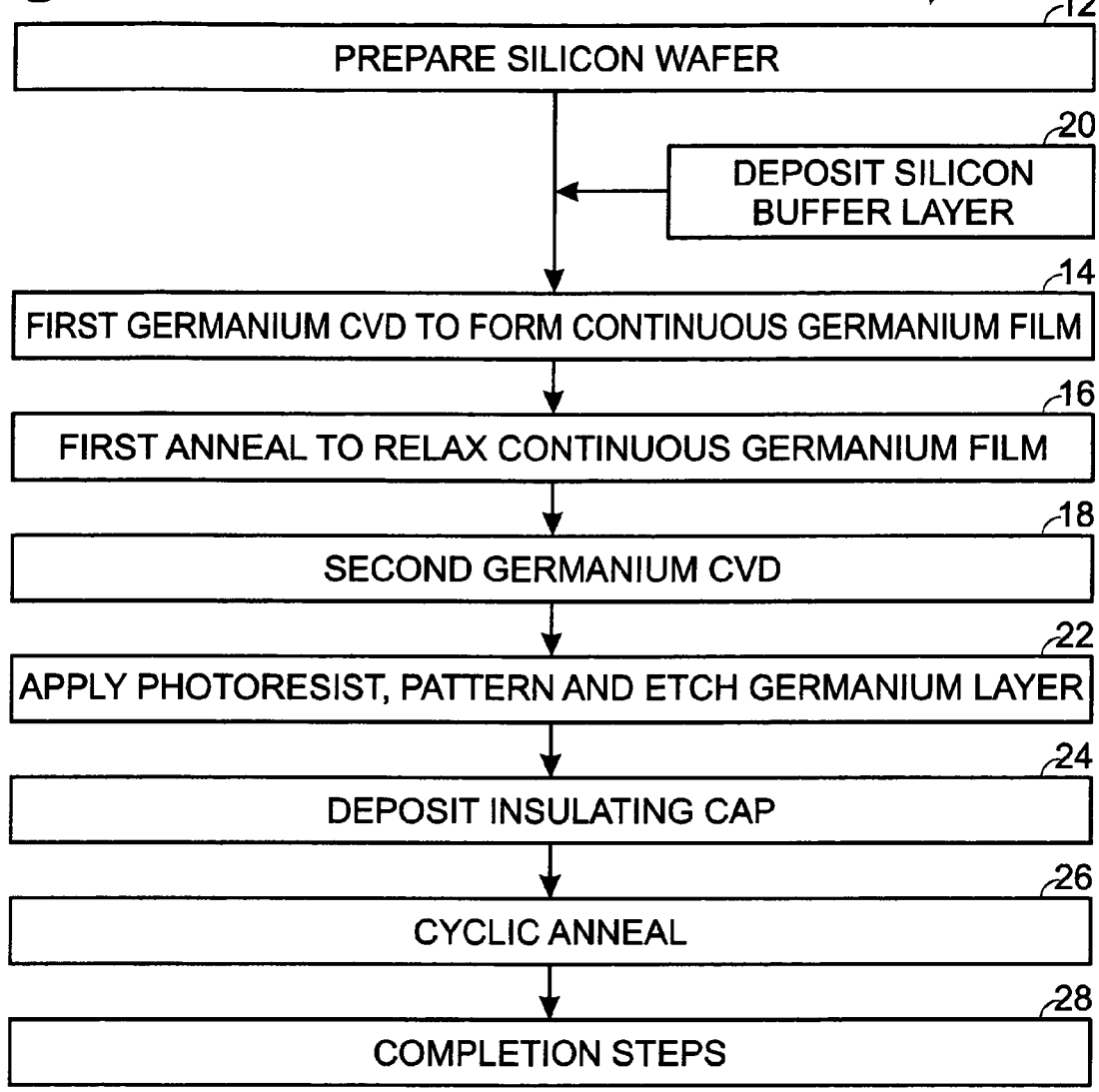
FIG. 1 is a block diagram of the method of the invention.

The method of the invention prevents cavity formation and enhances tensile strain of the germanium film by depositing a layer of dielectric material on the germanium film before a cyclic annealing step. The steps for preparing low defect strained epitaxial germanium on silicon are depicted in FIG. 1, generally at 10. A silicon wafer is prepared 12 for germanium deposition by dipping in DHF and a rapid rinse/dry cycle.

CVD of germanium film is done in a two-step process. A first germanium CVD is performed 14 at a low temperature, of between about 250° C. to 300° C., to form a continuous, first germanium film, having a thickness of between about 10 nm to 200 nm, which first germanium film is then annealed, during a first annealing step 16, at a temperature of about 700° C., which relaxes the continuous germanium film. A second layer of germanium is deposited to a thickness of between about 500 nm to 5 μm, at a temperature of between about 600° C. to 800° C., during a second germanium CVD step 18, depositing a second germanium film on the now relaxed first germanium film. A buffer layer of silicon may be deposited 20 before the first germanium deposition step.

The combination of the first and second germanium films, referred to herein as a germanium layer, is covered with photoresist, patterned and etched 22 using standard photolithographic and etching techniques to define structures of germanium devices. It is preferable to etch the structure before the cyclic annealing process. As described previously, smaller mesas of germanium on silicon exhibited a lower threading dislocation density, Luan et al., supra, than large germanium mesas.

A layer of insulating material, a dielectric layer, is deposited, 24. Initially, a layer of tetraethylorthosilicate oxide (oxane or TEOS), having a thickness of between about 50 nm to 500 nm, was used as the insulating material, however, other dielectric films, such as CVD oxide, CVD nitride, or films formed by PECVD, sputtering, evaporation, MOCVD, ALCVD, etc. may also be used at this point in the method of the invention, and, as described later herein, silicon nitride appears to be the best choice for the insulating material.

The germanium layer is cyclic annealed 26 in an argon ambient atmosphere to drive any defects to a region near the Ge/Si interface. The upper temperature of the cyclic anneal is between about 840° C. to 900° C., and the lower temperature of the cyclic anneal is between about 750° C. to 840° C. The number of cycles is between about 10 to 40, with each cycle having a duration of between about one to ten minutes. The temperatures are critical to prevent formation of unacceptable defects in the germanium layer. The presence of the dielectric layer, which is also a critical parameter, prevents the evaporation of germanium during the annealing steps of the method of the invention.

Additional steps are needed to complete 28 the process of CMOS device fabrication or fabrication of IR photodetector. Completion steps includes removal of the dielectric layer; ion implantation and activation before germanium deposition; implantation or deposition of doped silicon, SiGe, or a germanium layer after cyclic annealing; dielectric deposition and etching; and metallization. Because the method of the invention is directed to the formation of a low-defect strained epitaxial germanium-on-silicon layer, these other steps, which are well known to those of ordinary skill in the art, are not described in detail here.

Figure 2:
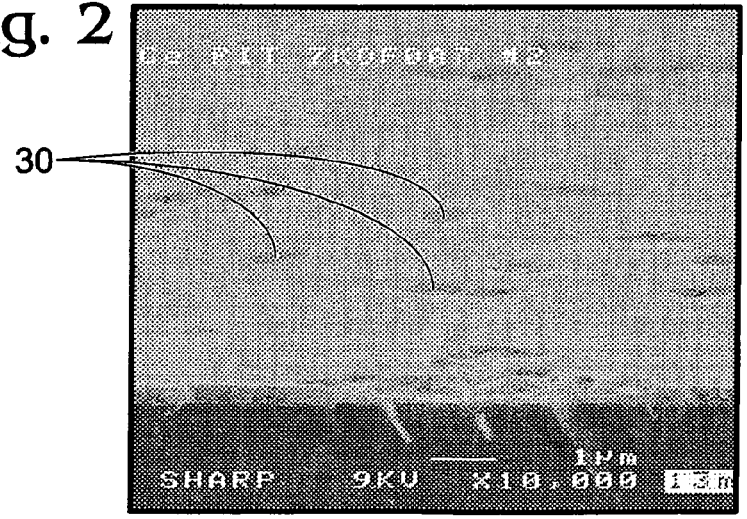
FIG. 2 depicts surface pits which are detected after a 500 nm thick germanium film has been annealed with the germanium film face in an argon ambient atmosphere.

A problem of surface roughness following cyclic annealing of the germanium film, which became more severe at higher temperature, or on smaller features, has been detected. An example is shown in the SEM micrographs of FIGS. 2–4. FIG. 2 depicts surface pits 30 which are detected after a 500 nm thick germanium film is annealed, with the germanium film facing the argon annealing ambient. This is sample 3 in Table 1. In order to understand the reason for formation of these surface cavities, a series of experiments was conducted, and the results presented in Table 1, which depicts individual germanium samples and cyclic annealing condition.

Figure 3:
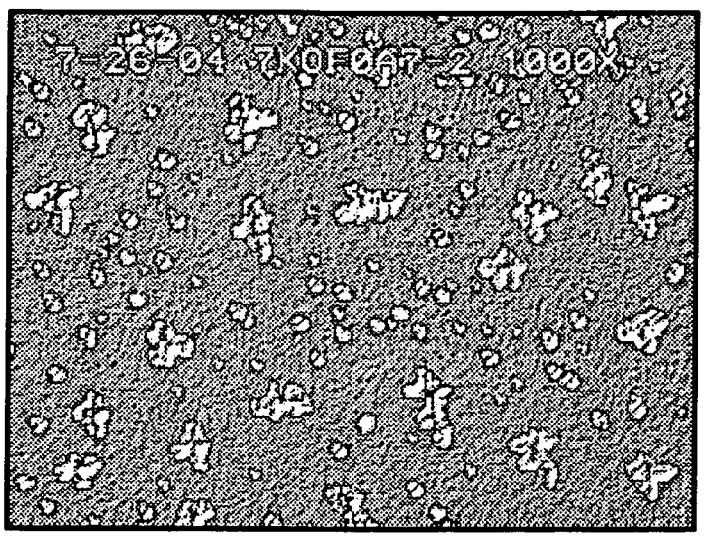
FIG. 3 depicts Normarski micrographs of sample #3 of Table 1.

Samples having a 500 nm thick germanium film were placed on a silicon support wafer, with the germanium surface either facing the silicon wafer, or facing up to an argon ambient atmosphere. The surface after cyclic annealing was very different, depending on whether the germanium surface was facing the silicon wafer or not. Samples #1 and #2 were annealed with germanium facing down to the silicon surface, and no cavities were detected. Sample #3 was annealed with germanium surface facing up to the argon ambient atmosphere, and severe cavity formation was detected. This is shown in FIGS. 2 and 3.

TABLE 1

| Sample # | TEOS?/ Film Up/Down | Temperature | Cycles | Roughness/ Surface |
|---|---|---|---|---|
| 1 | No/Film Down | 860° C.–740° C. | 10 | 5.5 nm/shiny |
| 2 | No/Film Down | 880° C.–760° C. | 20 | 1.5 nm/shiny |
| 3 | No/Film Up | 880° C.–760° C. | 20 | rough |
| 4 | 270 nmTEOS/Film Up | 880° C.–780° C. | 20 | shiny |
| 5 | 270 nmTEOS/Film Up | 900° C.–780° C. | 20 | shiny |
| 6 | 270 nmTEOS/Film Up | 860° C.–740° C. | 5 | shiny |
| 7 | 270 nmTEOS/Film Up | 920° C.–800° C. | 20 | rough |

A coating was detected on the RTA annealing chamber after the cyclic annealing experiments. The cavities in the germanium surface may have been caused by "thermal etching," or evaporation, from the germanium surfaces. When the germanium surface was placed against the silicon wafer, the thermal etching was less serious.

Figure 4:
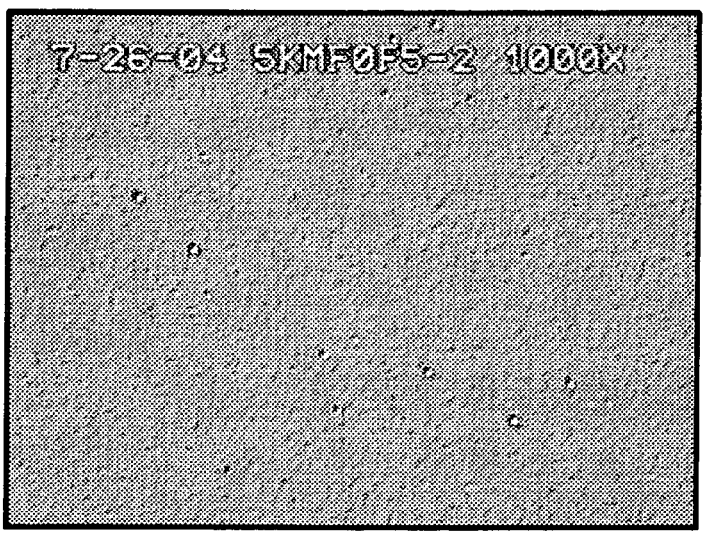
FIG. 4 depicts Normarski micrographs of sample #5 of Table 1.

In order to confirm this explanation, a layer of TEOS was deposited on samples 4, 5, 6 and 7 before cyclic annealing. The cyclic annealing results were consistent with the "thermal etching" theory. FIG. 4 depicts Sample 5, at cyclic annealing temperatures of 900° C. for five minutes and at 780° C. for five minutes. No cavities were detected, although the annealing temperature was relatively high. Therefore, the TEOS layer prevented the evaporation of germanium film during cyclic annealing.

Figure 5:
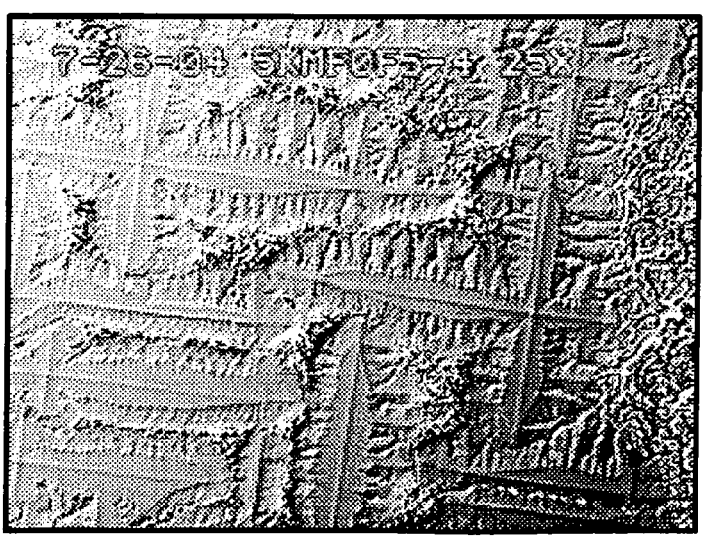
FIG. 5 depicts Normarski micrographs of sample #7 of Table 1.

At higher temperatures, as shown in FIG. 5, a different feature was observed. This appears to be due to melting and recrystallization of germanium film. The temperature was measured by thermocouple in contact with sample surface, although the actual temperature of the film may be slightly higher than 920° C., which is very close to the germanium melting point of 937° C.

Figure 6:
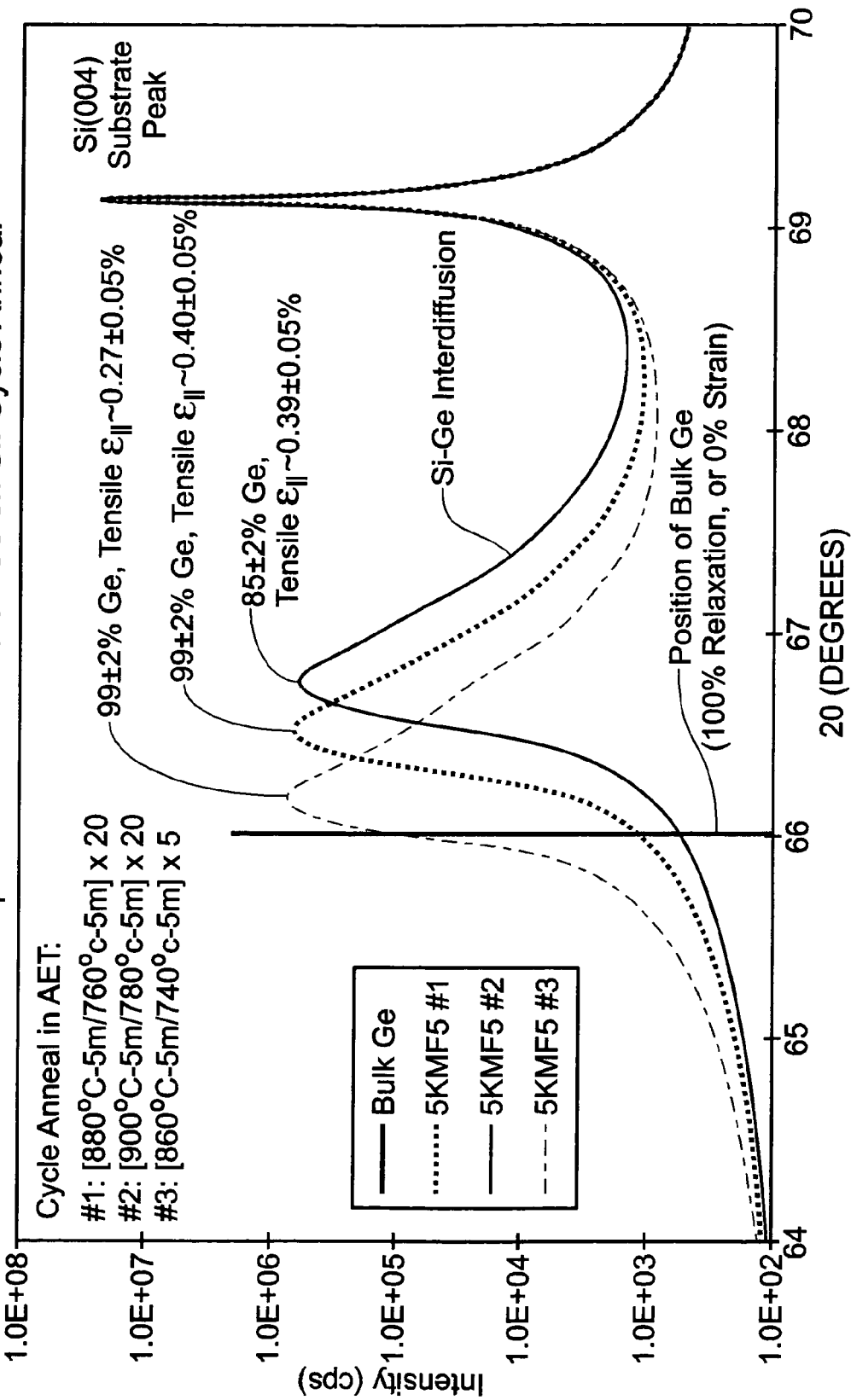
FIG. 6 depicts XRD (004) scans of germanium films with various numbers of annealing cycles.
Figure 7:
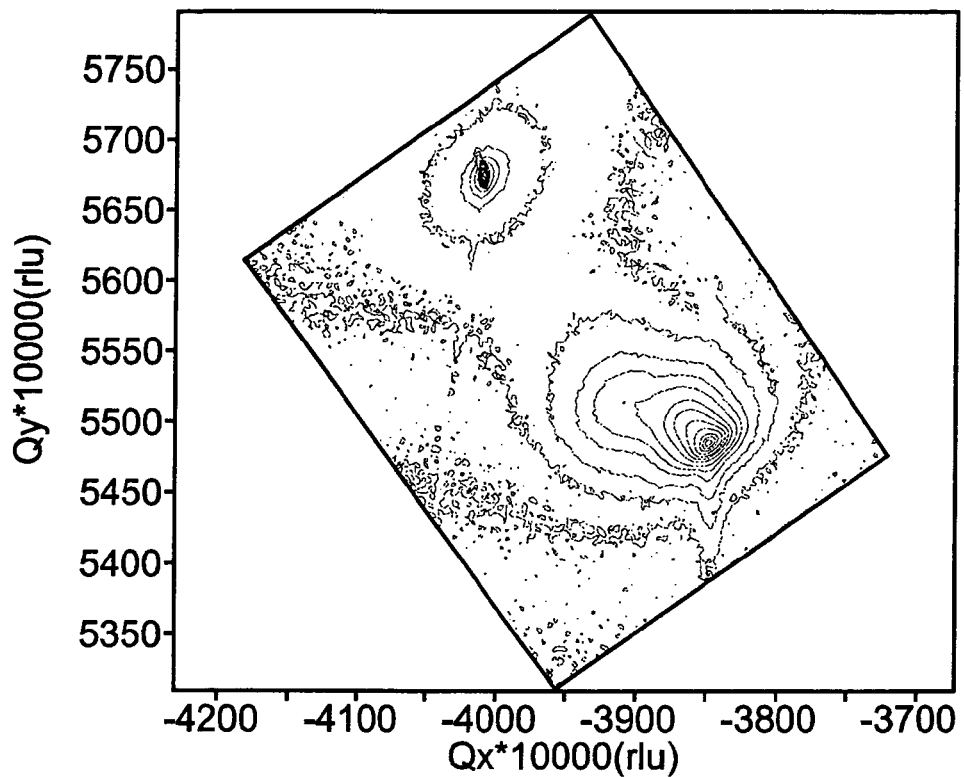
FIG. 7 depicts a (224) area map for sample #1 of Table 1.

FIG. 6 shows depicts a (004) XRD data of half-micron germanium films which underwent three different cyclic anneals. Each sample was also analyzed with a (224) area map, as shown in FIG. 7. The germanium concentration after cyclic annealing and the tensile strain are given in Table 2. The tensile was in the range of 0.25% to 0.40%. This strain is much higher than that reported in references Cannon et al and Liu et al., supra. This is believed to be as a result of the difference in thermal expansion coefficient between silicon and germanium, and from the effect of the 270 nm thick TEOS film during cyclic annealing. The TEOS films were removed before XRD measurements.

| Ge w/ TEOS | Temperature | Cycles | Surface | %-age Ge | %-age Tensile Strain |
|---|---|---|---|---|---|
| 270 nm TEOS Film Up | 880° C.–760° C. | 20 | shiny | 92 | 0.40 |
| 270 nm TEOS Film Up | 900° C.–780° C. | 20 | shiny | 85 | 0.39 |
| 270 nm TEOS Film Up | 860° C.–740° C. | 5 | shiny | 99 | 0.27 |

Table 2 Germanium % and Tensile Strain of Germanium after Cyclic Annealing

Figure 8:
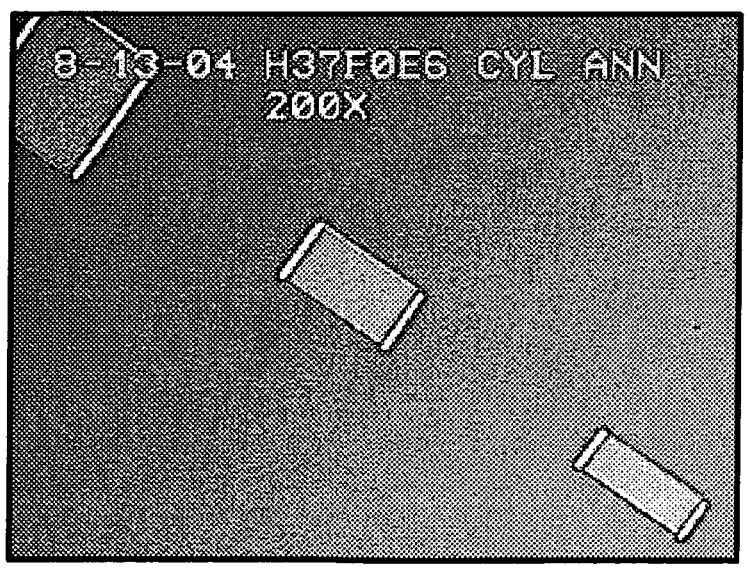
FIG. 8 depicts a germanium film covered with TEOS after cyclic annealing.

The issue of surface roughness resulting from cyclic annealing of germanium films and the solutions is described above. The surface roughness issue became more severe at higher temperature, or on smaller features. While solving the roughness problem by forming a TEOS cap over the germanium, the effects of a TEOS cap resulted in other problems. Without a cap layer, smaller features are more susceptible to cavity formation during cycle annealing. However, with a TEOS cap layer, the surface remains smooth after annealing at 900° C., as shown in FIG. 8, which depicts a 500 nm Ge film etched into small features and cyclic annealed at between about 900° C. to 780° C. for 20 cycles, wherein each cycle lasted for about five minutes at 900° C. and for about five minutes at 780° C. The surface was covered with about 270 nm of TEOS after the germanium was etched.

Figure 9:
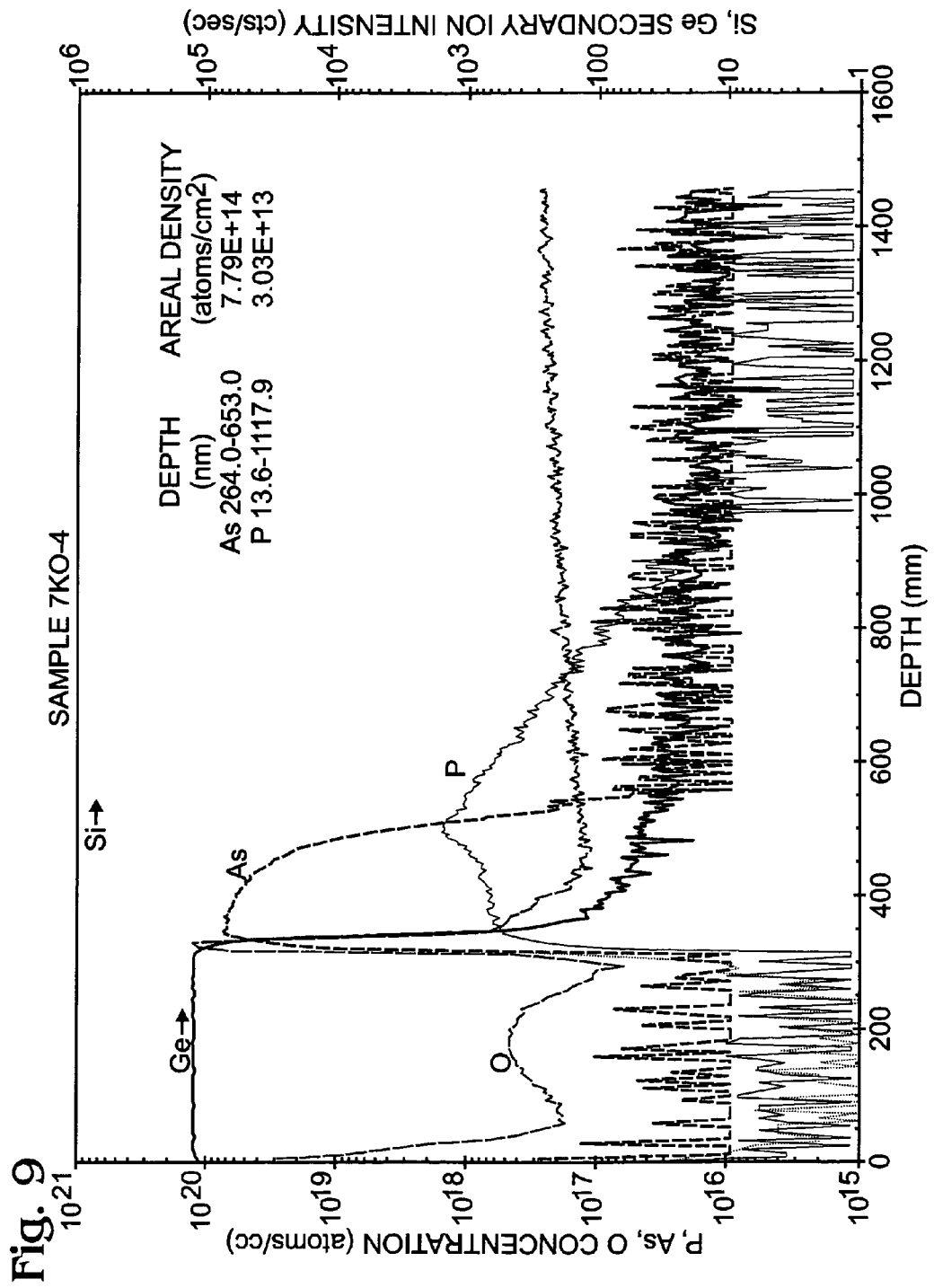
FIG. 9 is a SIMS profile of an as-deposited germanium film.
Figure 10:
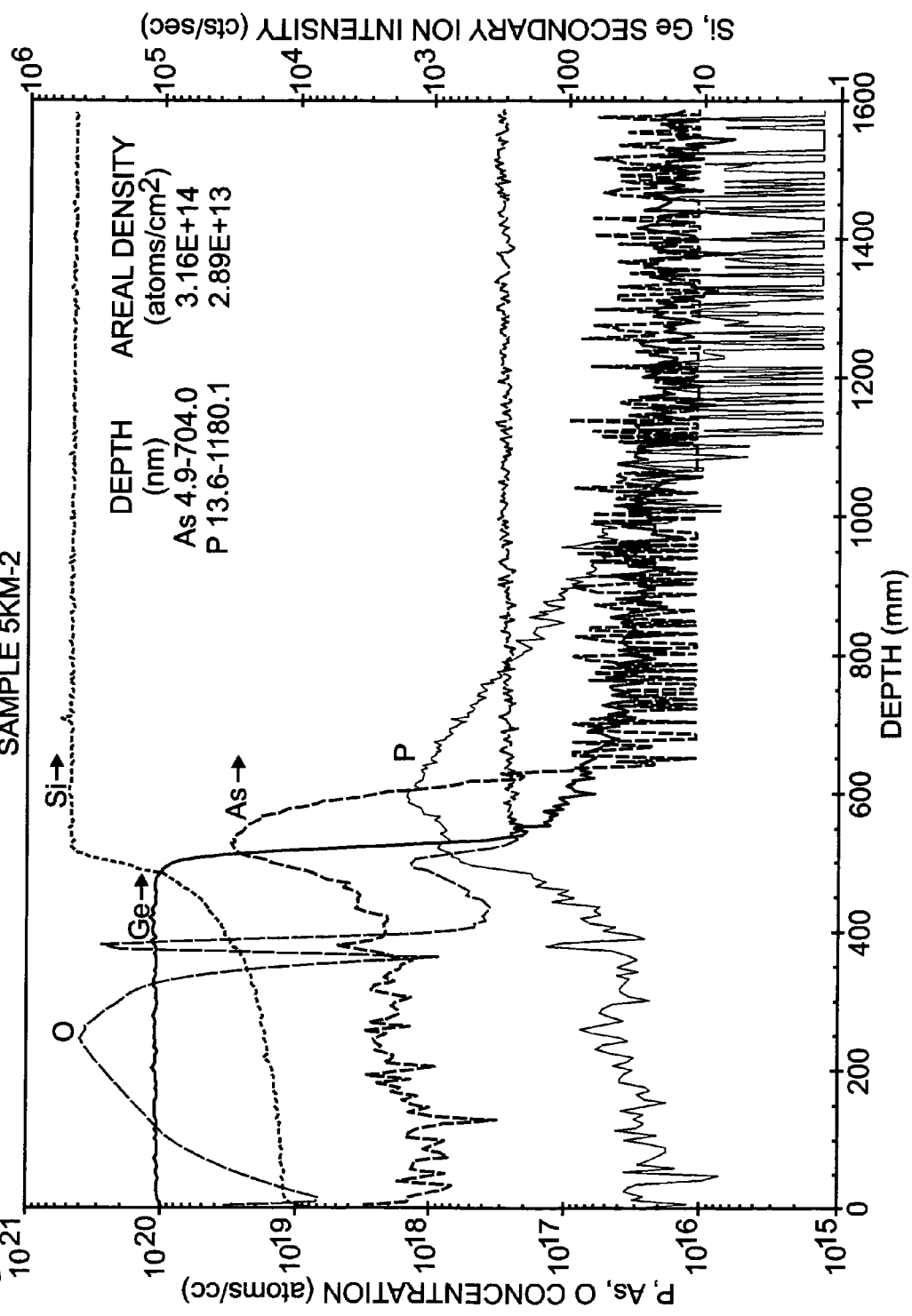
FIG. 10 is a SIMS profile of a germanium film after cyclic anneal according to the method of the invention.

An unexpected, and undesirable, phenomenon was detected after SIMS analyses of the cycle annealed samples. FIG. 9 depicts the SIMS profiles of a germanium as-deposited film, and FIG. 10 depicts the SIMS profile after cyclic annealing at between about 900° C. and 780° C. for twenty cycles. Two phenomena are evident: (1) there is a high oxygen content in the germanium film, and (2) there is silicon diffusion into the germanium film. Both of these phenomena are undesirable, and must be resolved before a germanium film may successfully be used in an IR application.

Figure 11:
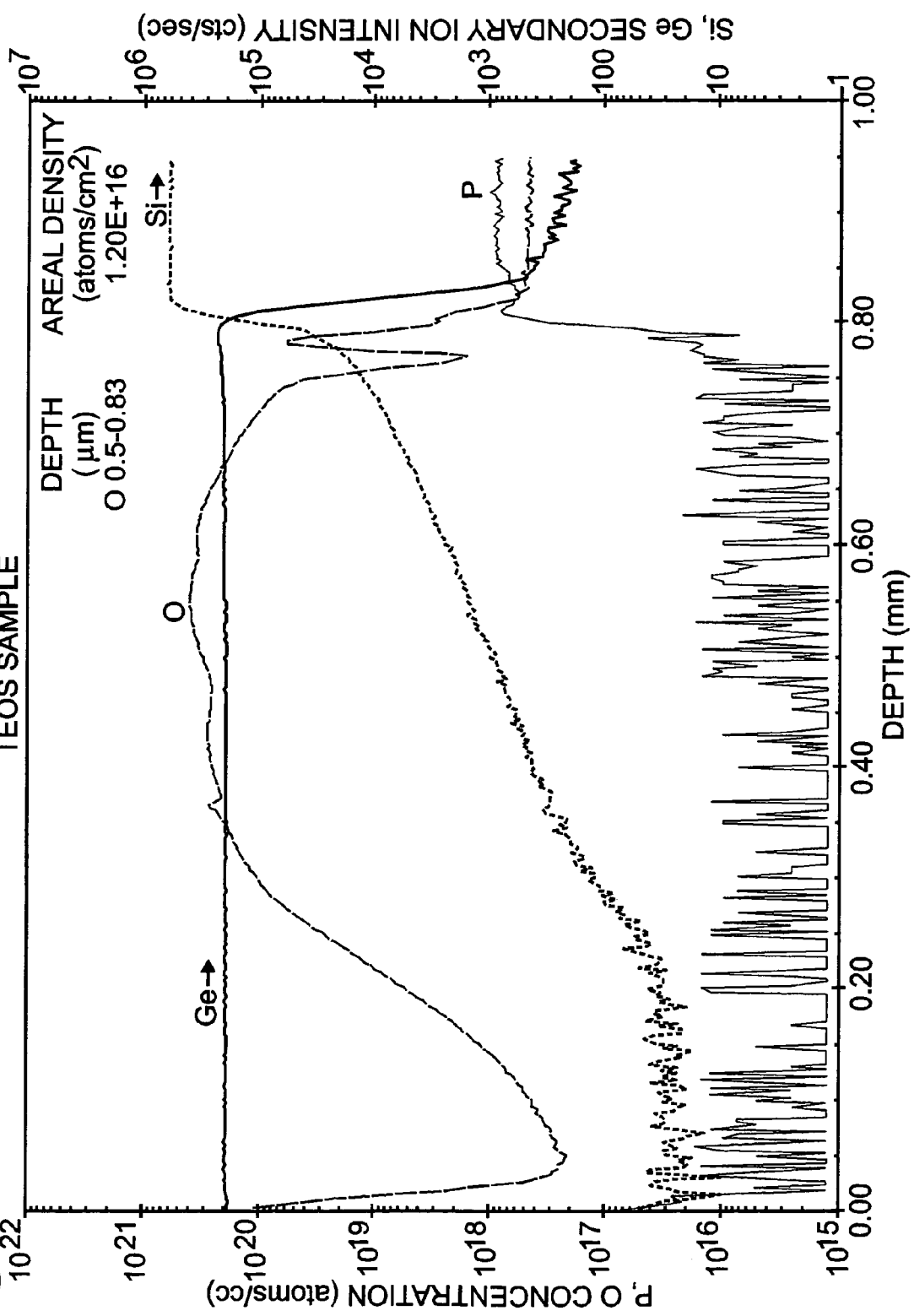
FIG. 11 is a SIMS profile of a TEOS capped germanium film after cyclic anneal.
Figure 12:
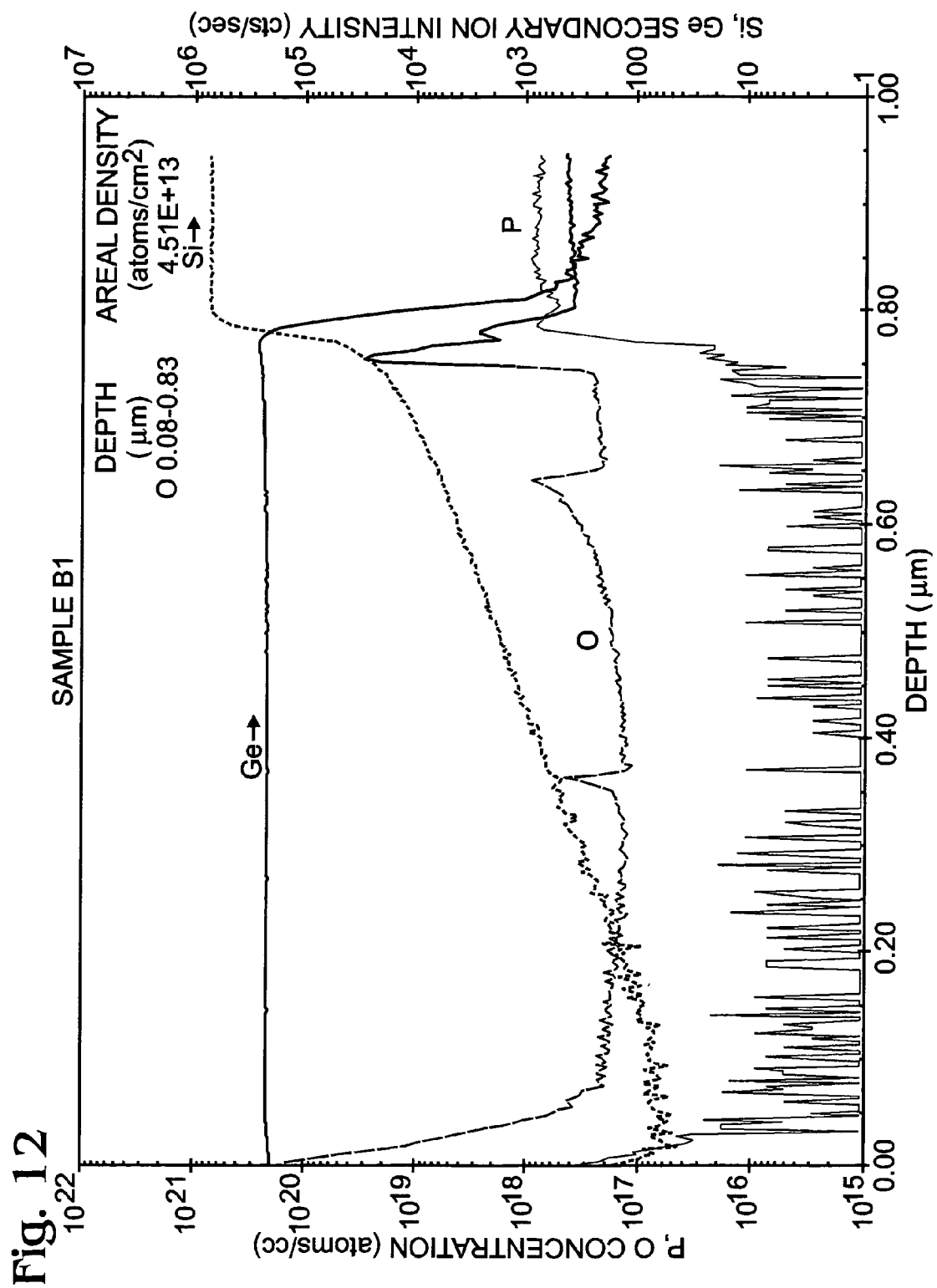
FIG. 12 is a SIMS profile of a germanium film after cyclic anneal, without the provision of a TEOS cap.
Figure 13:
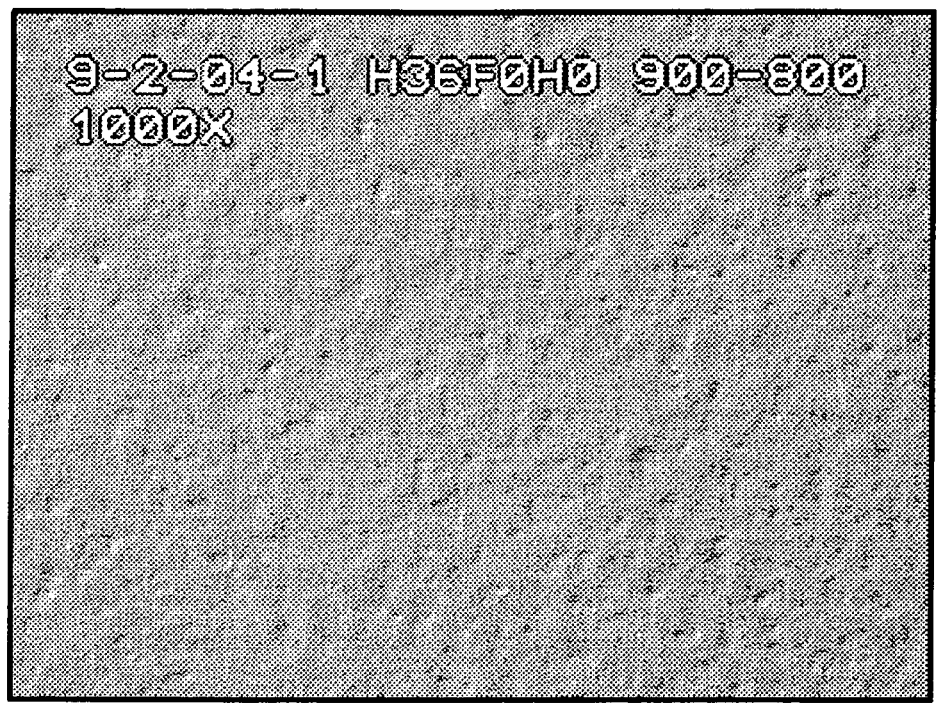
FIG. 13 depicts the surface features of a germanium film after a short cycle annealing, and without any cap layer.

In order to determine the source of oxygen in the germanium film, cyclic annealing was performed on a wafer having a germanium film with and without the TEOS cap layer, as shown in FIG. 11, a germanium film coated with about 270 nm of TEOS and cyclic annealed at 860° C. and 740° C., for five cycles, wherein each cycle included annealing for about five minutes at about 860° C. and for about five minutes at about 740° C., and FIG. 12, a germanium film without TEOS coating, and cyclic annealed at 860° C. and 740° C., for five cycles, wherein each cycle included annealing for about five minutes at about 860° C. and for about five minutes at about 740° C. The results clearly show that the TEOS film was the oxygen source.

As noted, there was also significant silicon diffusion into the germanium film. Additional SIMS work determined that the atomic ratio of silicon in germanium was about 20%. This problem also requires a solution before the germanium film of the method of the invention is suitable for IR applications.

In an attempt to eliminate the source of oxygen diffusion and reduce silicon diffusion, the TEOS layer was removed and the cyclic anneal duration time was reduced in an attempt to anneal the germanium using a much shorter anneal duration without a TEOS cap layer. If the germanium surface remained smooth after this short anneal, there would be no need to cover the germanium film. However, following a short anneal, e.g. 30 to 60 seconds, at between about 900° C. to 800° C. for ten cycles, without a cap layer, the surface was very rough, although cavities were not detected.

Figure 14:
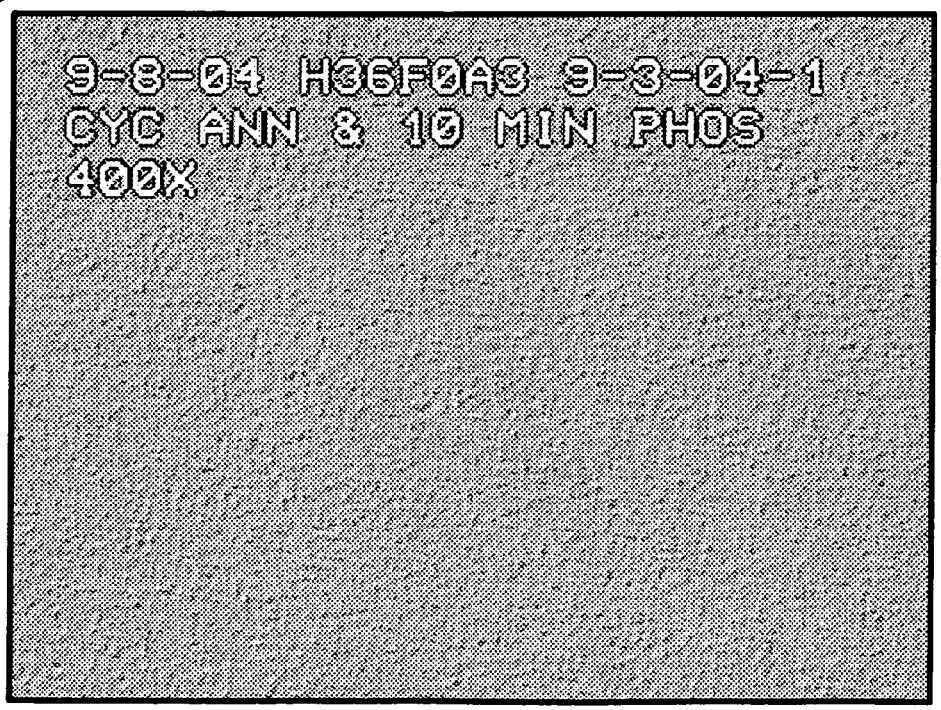
FIG. 14 depicts a 1 μm thick germanium film after provision of a silicon nitride layer during cyclic annealing, following removal of the silicon nitride layer.

In order to eliminate the source of oxygen as described above, and to provide a cap layer, a germanium film having a thin, e.g., about 30 nm, layer of silicon nitride, deposited by PECVD, before cyclic annealing was fabricated and tested. The thin nitride layer has been found to be sufficient to prevent surface roughness following cyclic annealing. This is shown in FIG. 14, wherein the surface remains smooth, as compared with the rough surface obtained following TEOS treatment and cyclic annealing. An added benefit to the use of silicon nitride is that the thin nitride layer may easily be removed in a hot phosphoric bath. e.g., between about 160° C. to 170° C., for about ten minutes. A prolonged test for about ten minutes demonstrated that the thickness of germanium was not changed, and the surface remained smooth, as shown in FIG. 14, which depicts a 1 µm germanium film coated with about 30 nm of silicon nitride and cyclic annealed at between about 880° C. and 760° C., wherein the 880° C. temperature was maintained for about one minute, and the 760° C. temperature maintained for about two minutes, for a total of 10 cycles. The film was then etched in hot phosphoric acid for about 10 min to remove the silicon nitride layer, without harming the germanium layer.

Figure 15:
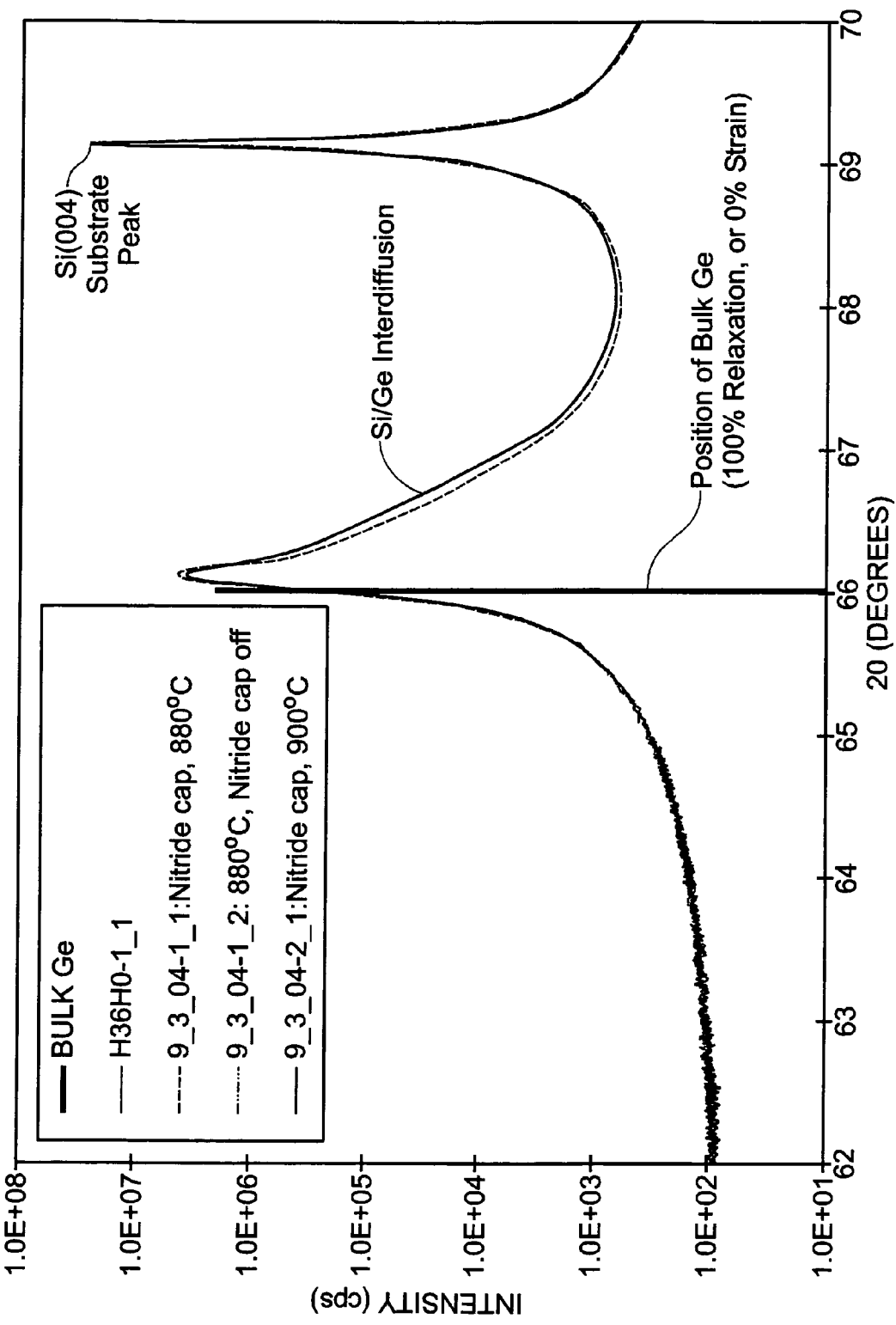
FIG. 15 depicts a XRD of the germanium film of FIG. 14.

XRD of the germanium film after cyclic annealling and removal of the silicon nitride cap is depicted in FIG. 15, which demonstrates that: (1) there is no obvious loss of germanium after the phosphoric acid etch, and, more importantly (2) there is no significant diffusion of silicon into the germanium film.

Figure 16:
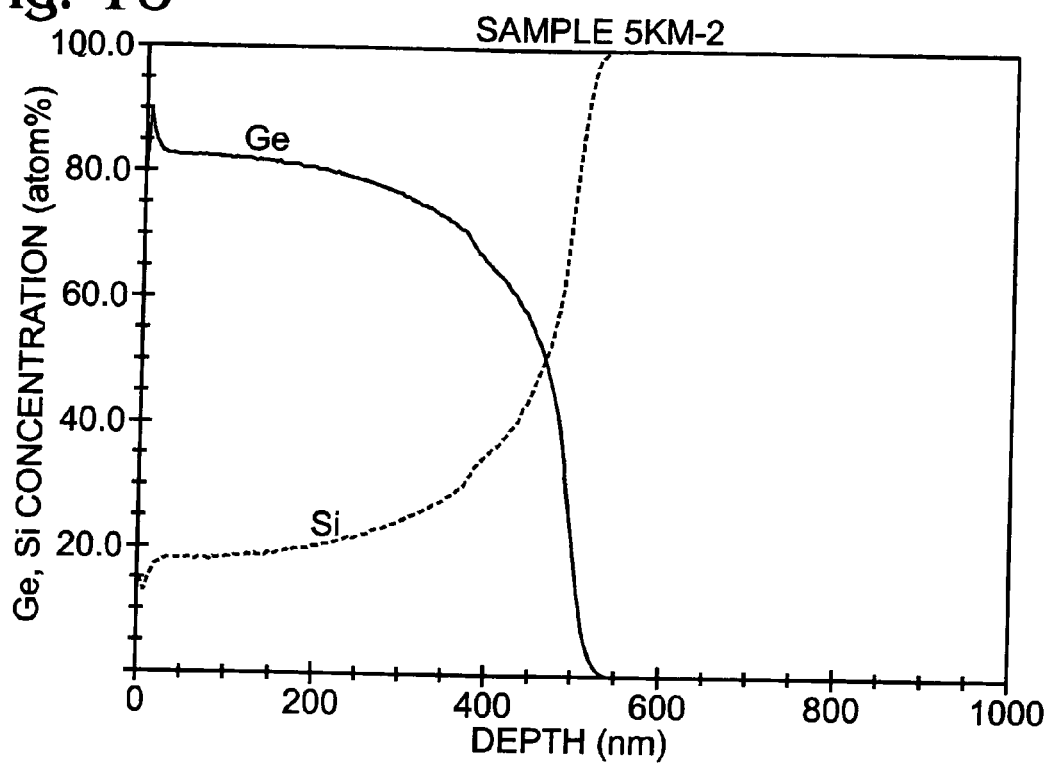
FIG. 16 is a SIMS of a TEOS capped germanium layer.
Figure 17:
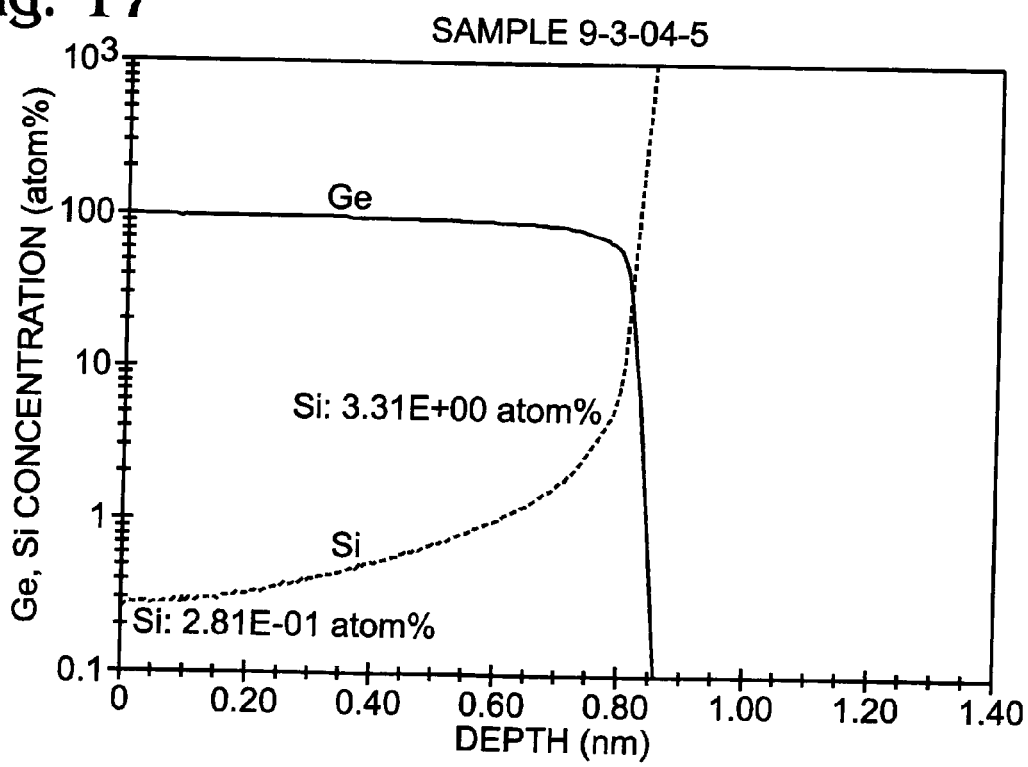
FIG. 17 is a SIMS of a silicon nitride capped germanium layer.

It is surprising to see the difference in silicon diffusion into the germanium when a TEOS layer is used and when a thin silicon nitride coating is used, as shown in FIGS. 16 and 17, respectively. FIG. 16 is a SIMS of a germanium layer covered with TEOS and cyclic annealed at between about 900° C. and 780° C. for 20 cycles. The atomic ratio of silicon in germanium is >20%, after annealing. FIG. 17 is a SIMS of a germanium layer covered with a thin silicon nitride layer and cyclic annealed at between about 900° C. and 780° C. for 20 cycles. The atomic ratio of silicon in germanium is <1% after annealing. With a TEOS coating, the silicon diffusion is substantial, e.g., greater than 20%, however, with the thin silicon nitride coating, the silicon content in most regions is less than 1% after annealing. The reasons for such a difference is not immediately clear, and may be related to (1) the oxygen contend of the film, which might act as a diffusion sink, and (2) the stress from TEOS, which, if substantial, may affect silicon diffusion. Thus, regardless of the mechanism, a thin silicon nitride coating resolves the problems of high oxygen content and substantial silicon diffusion. The germanium surface remains smooth in either case.

It has been known that cyclic annealing can reduce threading dislocation density of GaAs/Si through stress-induced dislocation movement, and improvement on a Ge/Si substrate have been reported. However, severe roughness and Si-Ge interdiffusion has been detected, which affects the progress of IR device fabrication. As previously noted, a thin nitride coating provides for a smooth surface, even after severe annealling, and does not promote extensive Si/Ge interdiffusion. The silicon nitride layer may be removed selectively in hot phosphoric acid, without affecting the Ge surface. Thus, the method of the invention may be used to fabricate other semiconductor-on-silicon devices.

Thus, a method for forming a low-defect strained epitaxial germanium layer on silicon has been disclosed. It will be appreciated that further variations and modifications thereof may be made within the scope of the invention as defined in the appended claims.

We claim:

1. A method of fabricating a germanium film on a silicon substrate, comprising:
    preparing a silicon substrate;
    depositing a first germanium film to form a continuous germanium film on the silicon substrate;
    annealing the silicon substrate and the first germanium film thereon in a first annealing process to relax the germanium film;
    depositing a second germanium film on the first germanium film to form a germanium layer;
    patterning and etching the germanium layer;
    depositing a layer of dielectric material on the germanium layer;
    cyclic annealing the silicon substrate having the germanium layer and dielectric material thereon; and
    completing a device containing the silicon substrate and germanium layer.

2. The method of claim 1 which includes depositing a buffer layer of silicon on the silicon substrate prior to said depositing the first germanium film.

3. The method of claim 1 wherein said depositing a first germanium film includes CVD of a germanium film at a temperature of between about 250° C. to 300° C.

4. The method of claim 1 wherein said annealing the silicon substrate and the first germanium film thereon in a first annealing process includes annealing the silicon substrate and the first germanium film at a temperature of about 700° C.

5. The method of claim 1 wherein said depositing a first germanium film on the silicon substrate includes depositing germanium by CVD to a thickness of between about 10 nm and 200 nm; and wherein depositing a second germanium film on the first germanium film includes depositing germanium by CVD to a thickness of between about 500 nm and 5 µm.

6. The method of claim 1 wherein said cyclic annealing the silicon substrate having the germanium layer and dielectric material thereon includes annealing at a first temperature of between about 840° C. to 900° C. and alternately annealing at a second temperature of between about 750° C. to 840° C., and wherein said cyclic annealing is repeated for between about 10 cycles to 40 cycles, and wherein each cycle lasts for between about one minute to ten minutes.

7. The method of claim 1 wherein said depositing a layer of dielectric material on the germanium layer includes depositing a layer of silicon nitride having a thickness of about 30 nm.

8. A method of fabricating a germanium film on a silicon substrate, comprising:
    preparing a silicon substrate;
    depositing a first germanium film to form a continuous germanium film on the silicon substrate;
    annealing the silicon substrate and the first germanium film thereon in a first annealing process to relax the first germanium film;
    depositing a second germanium film on the first germanium film to form a germanium layer;
    patterning and etching the germanium layer;
    depositing a layer of silicon nitride on the germanium layer having a thickness of between about 30 nm;
    cyclic annealing the silicon substrate having the germanium layer and silicon nitride thereon; and
    completing a device containing the silicon substrate and germanium film.

9. The method of claim 8 which includes depositing a buffer layer of silicon on the silicon substrate prior to said depositing a first germanium film.

10. The method of claim 8 wherein said depositing a first germanium film includes CVD of a germanium film at a temperature of between about 250° C. to 300° C.

11. The method of claim 8 wherein said annealing the silicon substrate and the germanium layer thereon in a first annealing process includes annealing the silicon substrate and the germanium layer thereon at a temperature of about 700° C.

12. The method of claim 8 wherein said depositing a first germanium film on the silicon substrate includes depositing germanium by CVD to a thickness of between about 10 nm and 200 nm; and wherein depositing a second germanium film on the first germanium film includes depositing germanium by CVD to a thickness of between about 500 nm and 5 µm.

13. The method of claim 8 wherein said cyclic annealing the silicon substrate having the germanium layer and silicon nitride thereon includes annealing at a first temperature of between about 840° C. to 900° C. and alternately annealing at a second temperature of between about 750° C. to 840° C., and wherein said cyclic annealing is repeated for between about 10 cycles to 40 cycles, and wherein each cycle lasts for between about one minute to ten minutes.

14. A method of fabricating a germanium film on a silicon substrate, comprising:
   preparing a silicon substrate;
   depositing a first germanium film to form a continuous germanium film on the silicon substrate;
   annealing the silicon substrate and the first germanium film thereon in a first annealing process to relax the germanium film;
   depositing a second germanium film on the first germanium film to form a germanium layer;
   patterning and etching the germanium layer;
   depositing a layer of silicon nitride, having a thickness of about 30 nm, on the germanium layer;
   cyclic annealing the silicon substrate having the germanium layer and dielectric material thereon, including annealing at a first temperature of between about 840° C. to 900° C. and alternately annealing at a second temperature of between about 750° C. to 840° C., and wherein said cyclic annealing is repeated for between about 10 cycles to 40 cycles, and wherein each cycle lasts for between about one minute to ten minutes; and
   completing a device containing the silicon substrate and germanium layer.

15. The method of claim 14 which includes depositing a buffer layer of silicon on the silicon substrate prior to said depositing a first germanium film.

16. The method of claim 14 wherein said depositing a first germanium film includes CVD of a germanium film at a temperature of between about 250° C. to 300° C.

17. The method of claim 14 wherein said annealing the silicon substrate and the germanium layer thereon in a first annealing process includes annealing the annealing the silicon substrate and the germanium layer thereon at a temperature of about 700° C.

18. The method of claim 14 wherein said depositing a first germanium film to form a continuous germanium film on the silicon substrate includes depositing germanium by CVD to a thickness of between about 10 nm and 200 nm; and wherein depositing a second germanium film on the first germanium film includes depositing germanium by CVD to a thickness of between about 500 nm and 5 µm.

* * * * *